PROCESS FOR HANDLING AND MOUNTING SEMICONDUCTOR DICE

Filed May 29, 1968 2 Sheets-Sheet 1

INVENTOR
ADAM FISCHER, JR.
BY
ATTORNEY

Jan. 12, 1971 A. FISCHER, JR 3,554,832

PROCESS FOR HANDLING AND MOUNTING SEMICONDUCTOR DICE

Filed May 29, 1968 2 Sheets-Sheet 2

INVENTOR

ADAM FISCHER, JR.

BY

ATTORNEY

United States Patent Office 3,554,832
Patented Jan. 12, 1971

3,554,832
PROCESS FOR HANDLING AND MOUNTING SEMICONDUCTOR DICE
Adam Fischer, Jr., Maplewood, N.J., assignor to RCA Corporation, a corporation of Delaware
Filed May 29, 1968, Ser. No. 733,094
Int. Cl. B32b *31/00*
U.S. Cl. 156—229 8 Claims

ABSTRACT OF THE DISCLOSURE

A scribed semiconductor wafer is detachably secured to a plastic film. The wafer is cracked along the scribed lines into individual dice which remain secured to the film. The film is stretched to provide a spaced array of the dice.

Each die is then mounted to a header by positioning the plastic film so that the die is adjacent the header. A rod is pushed against the plastic film opposite the die to depress the film and bring the die into contact with the header. When the die contacts the header, it adheres to the header and detaches from the plastic film.

BACKGROUND OF THE INVENTION

This invention relates to the manufacture of semiconductor components, and more particularly to the assembly of semiconductor dice to suitable packages therefor.

In the manufacture of semiconductor components, a large number of semiconductor devices are manufactured in a unitary semiconductor wafer. The wafer is then divided into individual dice, each die containing a single device, such as a diode, transistor or integrated circuit. These dice are randomly oriented and disarranged, so that each die must be picked up by an operator and properly oriented in order to permit assembly to a suitable package.

The sorting and orienting operations required to properly position the disarranged dice after separation from the wafer are costly. The handling of the dice during these operations often results in scratching the thin metallic connections to the various semiconductor regions on the die surface, so that the scratched dice must be discarded.

An object of the present invention is to provide a process for handling semiconductor dice after separation from a unitary wafer.

SUMMARY OF THE INVENTION

A process in which grooves are provided in a unitary wafer comprising a plurality of semiconductor devices, so that the grooves define weakened fracture planes between adjacent devices. One major surface of the wafer is detachably bonded to a flexible film.

The wafer is fractured along the weakened planes to separate adjacent devices. The separated devices remain secured to the film.

The film is stretched to produce a spaced-apart array of the devices and secured to an open frame.

DETAILED DESCRIPTION

Figure 1:
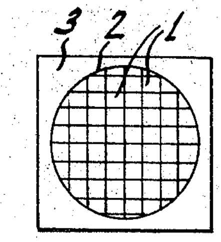
FIG. 1 shows a scribed and cracked semiconductor wafer disposed on a plastic film.

By conventional semiconductor manufacturing techniques, a large number of transistor or integrated circuit dice 1 are formed in a wafer 2, as shown in FIG. 1. The wafer 2 may comprise monolithic semiconductor material, or insulating material in which isolated semiconductor regions are embedded.

The wafer is adhesively bonded to a flexible film 3 which may comprise, e.g., a thermoplastic material such as plasticized vinyl.

The wafer 2 has been cracked along the lines separating the individual dice 1, so that the dice 1 are physically separated, and retained in relative position only by their adherence to the film 3.

Figure 2:
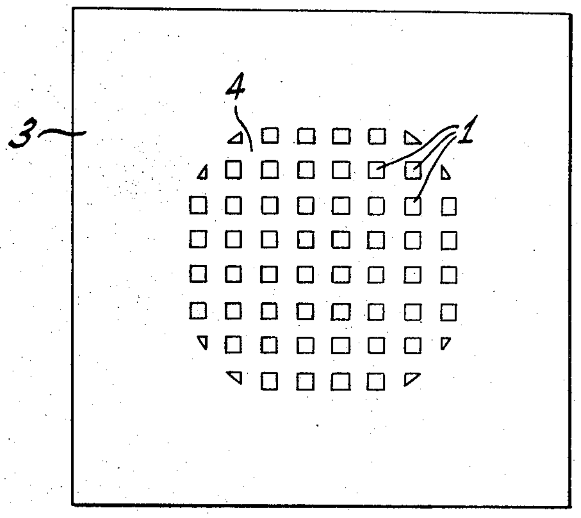
FIG. 2 shows the wafer of FIG. 1 after stretching of the plastic film.

The film 3 may be softened by heating, and stretched in a suitable manner to provide a spaced-apart array 4 of the individual semiconductor dice 1, as shown in FIG. 2. The process of converting the structure as shown in FIG. 1 to that of FIG. 2 is referred to herein as "expanding" the wafer 2. In its "expanded" form the array 4 may be handled and processed by relatively economical methods, since each of the dice 1 occupies an accurately defined position in a rectangular coordinate array.

In order to facilitate handling of the array 4 in the manner contemplated herein, it is useful to secure the periphery of the film 3 to an open frame or hoop, as will hereinafter be described.

In order to produce the array 4, a unitary semiconductor wafer is prepared by conventional techniques. The wafer is then scribed or etched along lines between the individual semiconductor devices, to form grooves along these lines which define weakened fracture planes in the wafer material.

Figure 3:
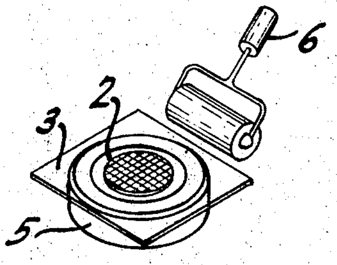
FIGS. 3, 4 and 5 depict process steps according to a preferred embodiment of the invention.

The grooved wafer is then detachably secured to a flexible film in the manner which is pictorially illustrated in FIG. 3.

As shown in FIG. 3, the grooved wafer 2 is held in position by a heated vacuum chuck 5, which is maintained at a temperature on the order of 200° to 250° F. A thin flexible film 3 is placed on the exposed wafer surface, and pressed into contact with the wafer surface by means of a hard rubber roller 6. The film 3 may preferably have a thickness on the order of 2 to 5 mils, and may comprise a plasticized vinyl, such as type KDA-2907 of Cadillac Plastics Company, Newark, N.J. Preferably, the film 3 should be transparent.

The temperature to which the vacuum chuck 5 is heated should be selected so that the film 3 is softened to the point where limited adherence to the wafer 2 is provided, so that at a later stage in the manufacturing process the individual dice of the wafer 2 may be detached from the film 3.

Where the individual dice 1 of the wafer 2 are relatively large, it may be difficult to limit the adherence between the dice and the film to an acceptably low value. In such cases, we have found that controllable adherence can be achieved by providing a textured surface on the face of the film 3 which contacts the wafer 2.

This textured surface may be provided, e.g., by placing the film 3 on a foraminated heated vacuum chuck, and applying a vacuum to draw small portions of the film material into the chuck foraminations. For the aforementioned vinyl, the chuck may be heated to 250° to 300° F. and then cooled, the vinyl film being positioned on the heated chuck for approximately 30 seconds.

Figure 4:
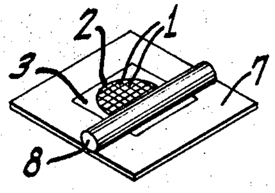

After securing the wafer 2 to the film 3, the wafer is then cracked as illustrated in FIG. 4, to mechanically separate the individual dice 1 by fracturing the wafer along the weakened planes defined by the scribed or etched grooves.

To crack the wafer, the film 3 is placed on a thin foam rubber support 7, and the exposed surface of the wafer 2 is covered with a sheet of paper (not shown) to prevent scratching of the wafer surface. A steel roller 8 is rolled across the paper to flex the wafer 2 so that cracking occurs along the lines between adjacent dice. The longitudinal axis of the roller 8 should be substantially parallel to the scribed or etched grooves. The longitudinal axis of the roller 8 is then rotated 90° to be parallel to the corresponding grooves, and once again rolled across the paper to complete the cracking process. After cracking each die 1 remains attached to the plastic film 3.

Either face of the wafer 2 may be secured to the plastic film 3, depending upon the subsequent handling operations which are contemplated. According to the preferred embodiment of my invention, the face of the wafer 2 upon which deposited metallic connections are disposed is in contact with the film 3, thus insuring against scratching of these connections during handling.

Figure 5:
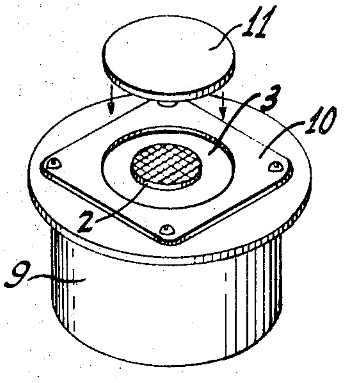

After cracking, the wafer 2 is expanded in the manner illustrated in FIG. 5. The plastic film 3 is peripherally secured to a vacuum housing 9 by means of a clamp plate 10, so that the wafer 2 extends upwardly. The plastic film 3 is then radiantly heated by an infrared lamp 11 to soften the film. Heat is applied to the film 3 for approximately 30 seconds, at which time vacuum is applied to the housing 9 to provide differential air pressure which forces the central portion of the film 3 downward into the housing 9. As the film 3 moves downward, its periphery being fixedly restrained by the clamp plate 10, the film stretches so that the individual dice 1 are moved apart.

Figure 6:
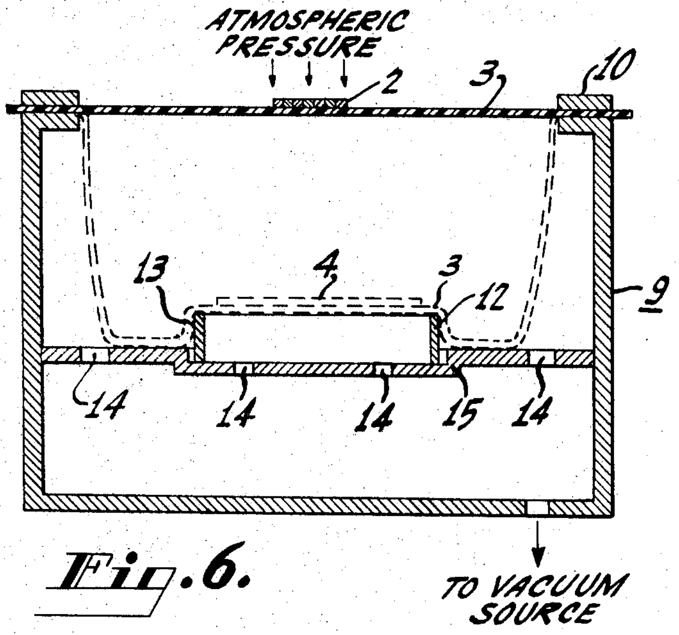
FIG. 6 shows a cross-sectional view of the apparatus employed in practicing the process step depicted in FIG. 5.

As the film 3 moves downward further into the housing 9, the film engages an open frame in the form of a hoop 12, as illustrated in FIG. 6. The sides of the hoop 12 are coated with an adhesive layer 13 which may be provided by, e.g., applying a double sided adhesive tape to the hoop sides. The differential gas pressure due to the vacuum source acting through the holes 14 in the hoop support 15 presses the portion of the film 3 which is peripheral to the now expanded array 4 against the adhesive layer 13, to secure the film 3 to the hoop 12.

Figure 7:
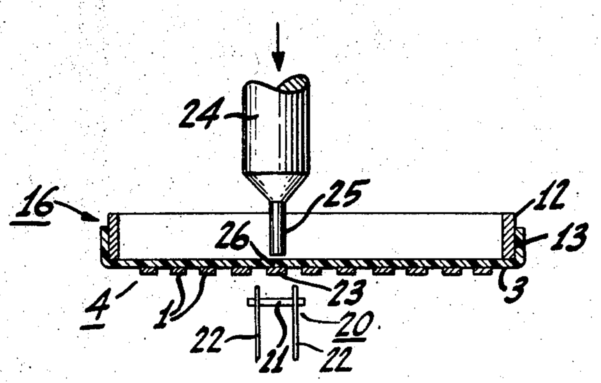
FIG. 7 depicts the step of mounting a semiconductor die to a header according to the preferred embodiment of the invention.

The vacuum source is then shut off, and the portion of the film 3 extending outwardly from the hoop 12 is trimmed off. The resultant structure, as shown in FIG. 7, comprises an intermediate article of manufacture 16 in which the stretched film 3 is peripherally secured to the hoop 12 by means of the adhesive layer 13.

The open geometry of the hoop 12 maintains tension in the film 3, and permits access to both sides of the film. The individual spaced-apart dice 1 of the expanded array 4 remain detachably secured to the film 3, each die occupying a precise position in the rectangular coordinate array 4.

In order to mount each die 1 to a package 20 comprising a header 21 having terminal leads 22 extending therefrom, the article 16 is positioned such that the particular die 23 to be packaged is adjacent the header 21.

A rod 24 having a small diameter and portion 25 is employed to downwardly depress the portion 26 of the film 3 adjacent the selected die 23, to move the die 23 into contact with the header 21.

The surface of the header 21 which receives the die 23 has been previously coated with a thin layer or a drop of a suitable adhesive such as an uncured or partially cured epoxy resin. When the die 23 contacts the header 21, this adhesive grasps the die and bonds it to the header.

The rod 24 is then retracted, and the resilience of the film 3 causes it to return to a substantially planar configuration, thus moving the film portion 26 away from the header 21, and detaching the die 23 from the film.

The article 16 may then be placed in proximity to another header so that another selected die can be mounted, etc. The positioning of the article 16 with respect to the header 21 and the movement of the rod 24 may be manually, semi-automatically or automatically controlled. The transparency of the film 2 facilitates alignment of each selected die with the corresponding header.

Instead of employing an adhesive layer or drop on the header 21 to secure the selected die 23, the surface of the die 23 adjacent the header 21 may be coated with a cured epoxy layer, preferably before the wafer 2 is grooved. A drop of epoxy solvent is then deposited on the header 21 before the die 23 is depressed into engagement therewith. When the epoxy coating on the die 23 is subsequently brought into contact with the header 21, the solvent dissolves a surface region of the epoxy layer. Upon evaporation of the solvent, the epoxy layer rehardens and adheres to the header 21.

Figure 8:
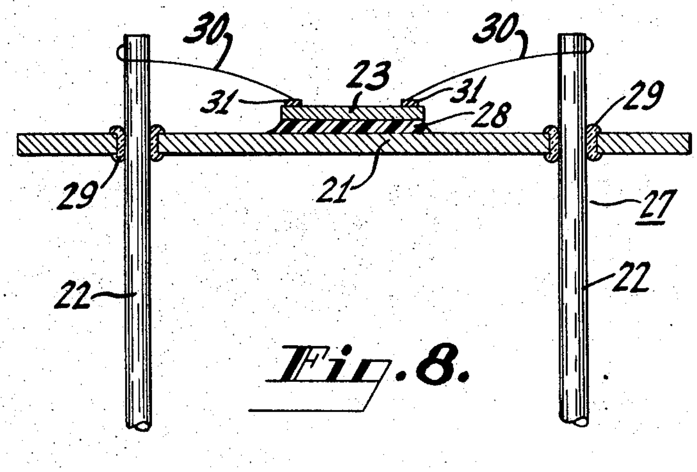
FIG. 8 shows the die and header of FIG. 7 after assembly thereof.

When the "solvent bonding" technique is employed, the resultant structure of the packaged transistor 27 is as shown in FIG. 8. The epoxy layer 28 secures the selected die 23 to the header 21. Terminal leads 22 extend through and are mechanically supported by and electrically insulated from the header 21 by glass seals 29. Small gold wires 30 electrically interconnect the terminal leads 22 with corresponding contact areas 31 on the exposed surface of the selected semiconductor die 23.

Figure 9:
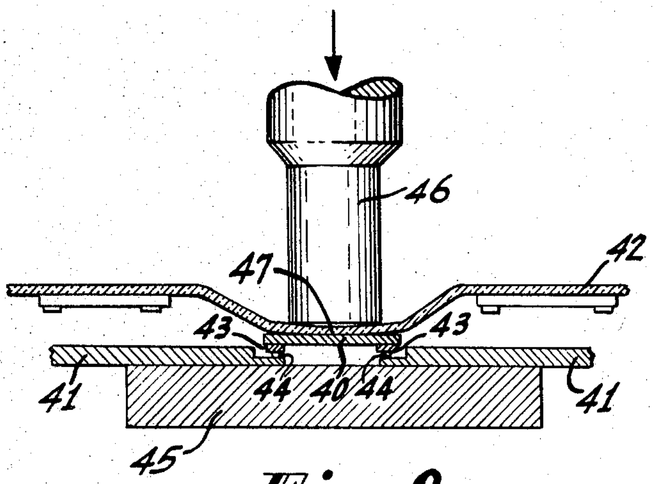
FIG. 9 shows the step of mounting a semiconductor die to a terminal lead structure according to an alternative embodiment of the invention.

The aforementioned techniques may also be employed to mount an integrated circuit die 40 to a terminal lead assembly having a number of inwardly extending metallic film segments 41, as illustrated in FIG. 9. The metallic film segments 41 may represent portions of a unitary metallic film, such as the structure shown in FIG. 3*a* of U.S. patent application Ser. No. 693,833, filed Dec. 27, 1967, and assigned to the assignee of the instant application.

An article, similar to article 16, is prepared by the aforementioned techniques, in which a transparent flexible vinyl film 42 supported by a hoop (not shown) has a plurality of spaced-apart integrated circuit dice 40 detachably secured thereto, the dice 40 being arranged in the form of a rectangular coordinate array, produced by expanding cracked wafers containing the integrated circuits.

Each of the integrated circuit dice 40 is secured to the film 42 so that raised terminal pads 43 on each die are exposed, i.e. not in contact with the film. Each of the raised terminal pads 43 is electrically connected to an operating semiconductor region of the die 40 by means of a suitable metallized pattern on the die surface. Preferably, each of the pads 43 is coated with a thin layer comprising a suitable solder such as tin.

The metallic film segments 41 of the terminal lead assembly have contact areas 44 on the inner ends thereof. The contact areas 44 are substantially coplanar, are preferably coated with a suitable solder such as tin, and are in registration with the corresponding die terminal pads 43.

The film segments 41 supported by a metallic platen 45, which is heated to the proper temperature for forming solder connections between the contact areas 44 and the terminal pads 43.

A rod 46 is employed to depress the portion 47 of the film 42 which is adjacent the die 40 to be mounted. When the terminal pads 43 of the die 40 contact the heated contact areas 44 of the film segments 41, the resultant solder bond, i.e. the surface tension of the molten solder, causes initial adherence of the contact areas 44 to the terminal pads 43.

The rod 46 is then rapidly retracted, before undesirable heating of the film 42 takes place, and the resilience of the stretched film 42 causes movement of the film portion 47 away from the film segments 41, with resultant detachment of the die 40 from the film 42.

The terminal lead assembly may then be removed from the heated platen 45 and the solder bonds between the terminal pads 43 and the corresponding contact areas 44 allowed to cool.

I claim:

1. A semiconductor component manufacturing process, comprising the steps of:
- providing a unitary wafer comprising a plurality of semiconductor devices,
- forming grooves in said wafer defining weakened fracture planes between adjacent devices,
- detachably bonding one major surface of the wafer to a flexible film,
- fracturing said wafer along said weakened planes to separate said adjacent devices, said devices remaining secured to said film,
- stretching said film to produce a spaced-apart array of said devices thereon; and
- securing said stretched film to an open frame.

2. A process according to claim 1, wherein each of said devices comprises a die having (i) a number of operating semiconductor regions and (ii) a corresponding number of terminal pads on a selected surface of the die, each pad being electrically coupled to a corresponding operating region.

3. A process according to claim 1, wherein said film comprises a thermoplastic material, and said stretching step comprises:
- radiantly heating said film to soften the thermoplastic material, and
- subjecting the surfaces of said film to differential gas pressure, while fixedly restraining the periphery of the film.

4. A process according to claim 1, wherein the surface of said film secured to said wafer is textured.

5. A process according to claim 2, wherein said terminal pads are disposed on said one wafer surface, comprising the additional steps of:
- providing a header having a number of terminal leads extending therefrom,
- after said securing step, disposing said film in juxtaposition with said header, so that the other major surface of said wafer faces said header, and a selected die is disposed adjacent said header,
- depressing a limited surface portion of said flexible film opposite said selected die, to move said die into contact with said header,
- bonding said die to said header, and
- detaching said selected die from said flexible film.

6. A process according to claim 5, comprising the additional step of, after said detaching step, electrically connecting each terminal pad of the selected die to a corresponding header terminal lead.

7. A process according to claim 2, wherein said terminal pads are disposed on the other surface of said wafer, comprising the additional steps of:
- providing a terminal lead assembly having a number of inwardly extending metallic film segments, the inner ends of said segments forming substantially coplanar contact areas registrable with corresponding terminal pads on a selected die;
- disposing said film in juxtaposition with said assembly, so that the other major surface of said wafer faces said header, and the terminal pads of said selected die are in registration with said contact areas,
- depressing a limited surface portion of said flexible film opposite said selected die, to move each of said terminal pads into contact with a corresponding one of said contact areas,
- bonding said terminal pads to said corresponding contact areas, and
- detaching said selected die from said flexible film.

8. A semiconductor component manufacturing process, comprising the steps of:
- providing a unitary wafer comprising a plurality of semiconductor devices, each of said devices having (i) a number of operating semiconductor regions and (ii) a corresponding number of terminal pads on a selected surface of the device, each pad being electrically coupled to a corresponding operating region,
- detachably bonding one major surface of the wafer to a flexible film,
- separating said device from said wafer, said separated devices remaining secured to said flexible film;
- stretching said film to produce a spaced-apart array of said device thereon,
- securing said stretched film to an open frame,
- providing a substrate for receiving a selected one of said devices,
- after said securing step, disposing said film in juxtaposition with said substrate, so that a selected device is disposed adjacent said substrate,
- depressing a limited surface portion of said flexible film opposite said selected device to move said device into contact with said substrate,
- bonding said device to said substrate, and
- detaching said selected device from said flexible film.

References Cited

UNITED STATES PATENTS 3,035,690 5/1962 Frohbach ............ 206—56

HAROLD ANSHER, Primary Examiner

J. C. GIL, Assistant Examiner

U.S. Cl. X.R.

156—230, 241, 257